(12) United States Patent
Meyer et al.

(10) Patent No.: US 7,906,860 B2
(45) Date of Patent: Mar. 15, 2011

(54) SEMICONDUCTOR DEVICE

(75) Inventors: Thorsten Meyer, Regensburg (DE); Markus Brunnbauer, Lappersdorf (DE); Marcus Kastner, Regensburg (DE); Stephan Bradl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 650 days.

(21) Appl. No.: 11/925,312

(22) Filed: Oct. 26, 2007

(65) Prior Publication Data

US 2009/0108440 A1 Apr. 30, 2009

(51) Int. Cl.
*H01L 23/29* (2006.01)

(52) U.S. Cl. ............... 257/790; 257/E21.502; 257/723; 257/778; 257/787; 438/124; 438/126; 438/127

(58) Field of Classification Search ........... 257/E21.499, 257/E21.502, E23.135, 659, 690, 698, 699, 257/704, 723, 778, 787, 790; 438/112, 127; 174/260; 361/812; 29/841
See application file for complete search history.

(56) References Cited

U.S. PATENT DOCUMENTS

| | | | | |
|---|---|---|---|---|
| 5,311,059 A * | 5/1994 | Banerji et al. | ............... | 257/778 |
| 5,381,599 A * | 1/1995 | Hall | ............... | 29/856 |
| 5,734,201 A * | 3/1998 | Djennas et al. | ............... | 257/783 |
| 5,737,191 A * | 4/1998 | Horiuchi et al. | ............... | 361/764 |
| 6,166,434 A * | 12/2000 | Desai et al. | ............... | 257/704 |
| 6,288,900 B1 * | 9/2001 | Johnson et al. | ............... | 361/705 |
| 6,353,263 B1 * | 3/2002 | Dotta et al. | ............... | 257/777 |
| 6,354,485 B1 * | 3/2002 | Distefano | ............... | 228/179.1 |
| 6,369,449 B2 * | 4/2002 | Farquhar et al. | ............... | 257/778 |
| 6,376,769 B1 * | 4/2002 | Chung | ............... | 174/524 |
| 6,518,090 B2 * | 2/2003 | Saza et al. | ............... | 438/106 |
| 6,621,172 B2 * | 9/2003 | Nakayama et al. | ............... | 257/787 |
| 6,713,878 B2 * | 3/2004 | Goetschalckx | ............... | 257/778 |
| 6,747,350 B1 * | 6/2004 | Lin et al. | ............... | 257/704 |
| 6,879,030 B2 * | 4/2005 | Tsai et al. | ............... | 257/680 |
| 6,992,400 B2 | 1/2006 | Tikka et al. | | |
| 6,998,296 B2 * | 2/2006 | Reiss | ............... | 438/112 |
| 7,091,623 B2 * | 8/2006 | Tsai et al. | ............... | 257/783 |
| 7,173,336 B2 * | 2/2007 | Sakamoto et al. | ............... | 257/739 |
| 7,187,060 B2 * | 3/2007 | Usui | ............... | 257/659 |
| 7,205,674 B2 * | 4/2007 | Huang et al. | ............... | 257/787 |
| 7,268,067 B2 * | 9/2007 | Hall et al. | ............... | 438/617 |
| 7,319,275 B2 * | 1/2008 | Cowens et al. | ............... | 257/778 |
| 7,445,963 B2 * | 11/2008 | Ho et al. | ............... | 438/113 |
| 7,534,002 B2 * | 5/2009 | Yamaguchi et al. | ............... | 362/84 |
| 7,619,304 B2 * | 11/2009 | Bauer et al. | ............... | 257/678 |

(Continued)

OTHER PUBLICATIONS

"Embedded Wafer Level Ball Grid Array (eWLB)", M. Brunnbauer, et al., 2006 Electronics Packaging Technology Conference, 2006 IEEE.

*Primary Examiner* — Chris Chu

(74) *Attorney, Agent, or Firm* — Dicke, Billig & Czaja, PLLC

(57) ABSTRACT

A semiconductor device is disclosed. One embodiment provides an arrangement of a plurality of semiconductor chips arranged side by side in a spaced apart relationship. A first material fills at least partly the spacings between adjacent semiconductor chips. A second material is arranged over the semiconductor chips and the first material. A coefficient of thermal expansion of the first material is selected to adapt the lateral thermal expansion of the arrangement in a plane intersecting the first material and the semiconductor chips to the lateral thermal expansion of the arrangement in a plane intersecting the second material.

18 Claims, 6 Drawing Sheets

U.S. PATENT DOCUMENTS

| | | | |
|---|---|---|---|
| 7,635,912 B2 * | 12/2009 | Ejima | 257/678 |
| 7,723,162 B2 * | 5/2010 | Anderson et al. | 438/123 |
| 2002/0168798 A1 * | 11/2002 | Glenn et al. | 438/110 |
| 2002/0187591 A1 * | 12/2002 | Bai | 438/126 |
| 2005/0064628 A1 * | 3/2005 | Doescher | 438/110 |
| 2005/0151246 A1 * | 7/2005 | Daeche et al. | 257/723 |
| 2006/0151203 A1 * | 7/2006 | Krueger et al. | 174/260 |
| 2008/0265383 A1 * | 10/2008 | Brunnbauer et al. | 257/659 |

* cited by examiner

SEMICONDUCTOR DEVICE

BACKGROUND

The invention relates to semiconductor devices and in one embodiment the technique of fabricating semiconductor devices.

Semiconductor devices may be fabricated by separating single dies from a wafer, rearranging them on a carrier and packaging them in plastics. Different thermal properties of the materials involved may cause stress or limit the maximum size of the plastic compound.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
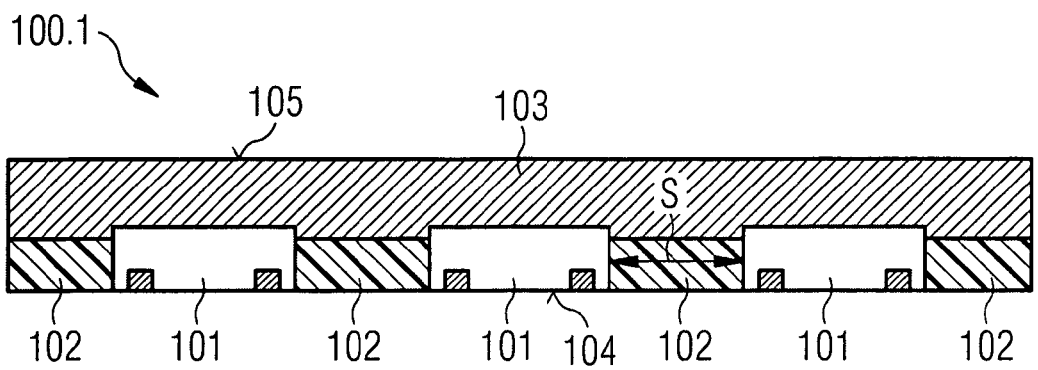
FIG. 1 schematically illustrates a first embodiment of an arrangement of semiconductor chips.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One or more embodiments provide a plurality of semiconductor chips and at least two different layers which may be made of a first material and a second material, and may both be made of moldable plastics. The properties of the first and second material are described further below.

In such arrangements, the semiconductor chips are placed side by side in a spaced apart relationship and are surrounded by at least the first material or by the first and the second material, thus forming a disc-like arrangement. Arrangements in which semiconductor chips are embedded in a mold material are referred to as "reconfigured wafer" or "artificial wafer" in the art.

The arrangements include semiconductor chips which may be of different types and may include, for example, integrated electrical or electro-optical circuits. The semiconductor chips may be configured to include movable mechanical members which are formed as micro-mechanical structures, such as bridges, membranes or tongue structures. Chips including such structures are also known under the term "micro-electro mechanical system" or briefly MEMS. The semiconductor chips may be configured as sensors or actuators, for example pressure sensors, acceleration sensors, rotation sensors, angular position sensors, motion sensors, microphones, Hall-sensors or GMR-sensors (GMR: Giant-Magneto-Resistance) etc. Semiconductor chips in which such functional elements are embedded generally contain electronic circuits which serve for driving the functional elements and/or for processing signals generated by the functional elements. The semiconductor chips need not be manufactured from specific semiconductor material and, furthermore, may contain inorganic and/or organic materials that are not semiconductors, such as for example metals, insulators or plastics.

The first material may be made of a foil or a curable liquid and may fill at least partly the spacings between the semiconductor chips. If the first material is made of a foil it may be made of any thermoplastic material or a so called b-stage material. Those materials are not completely chemically linked until a next curing process or any other addition of energy is performed. If the first material is made of a curable liquid it may be made of any appropriate thermoplastic or thermosetting material. Possible materials are, for example, epoxy resins, phenol resins or thermosetting plastics. Both, the foil and the curable liquid may be filled by a filling material ("filler") to modify and specifically set their mechanical and/or thermal expansion properties.

As fillers a variety of materials are possible, e.g., mineral fillers, steel fillers, titanium fillers, aluminum fillers, copper fillers, zinc fillers, ceramic fillers like carborundum, zircon or boron nitride fillers, glass particles or the like. The particle size of the fillers, the filler material and the filling degree affect the thermal expansion coefficient of the cured first material. Further, a composite filler may be used which is made of a mixture of the aforementioned fillers.

Various techniques may be employed to apply the first material into the spacings between adjacent semiconductor chips. In case of liquefied plastics, for example, printing or dispensing techniques may be used. In printing techniques, the first material is transferred by a squeegee and a stencil or screen to the area to be printed on. In dispensing techniques, a certain quantity of liquid material is dispensed through a capillary to the area to be loaded with the material. If a foil is used, it may be deposited onto the semiconductor chips, heated up e.g., above its melting temperature and brought into the spacings by applying pressure—e.g., mechanically through a stamping process and/or by the application of atmospheric pressure (vacuum) or a lamination process. Alternatively, a masked foil could be used which is equipped with cut-outs at the positions of the semiconductor chips.

The second material may be made of any appropriate thermoplastic or thermosetting material. Various techniques may be used to cover the semiconductor chips and the first material with the second material. Possible techniques are for example compression molding, injection molding, open-cavity casting, dispensing or printing. In compression molding, a carrier supporting the semiconductor chips and the first material is introduced between two mold halves, the liquid second material is introduced into the mold and is then subjected to pressure exerted by moving the mold halves together. In injection molding, the liquid second material is injected in a closed cavity mold tool containing the carrier which supports the semiconductor chips and the first material. In open-cavity casting, an open cavity mold is used to receive the liquid molding material. In dispensing, which may be carried out as a mold-free process, a predefined amount of liquid molding material is supplied to the semiconductor chips and the first material. The application process of the first and the second material can be different.

As already mentioned, the arrangements described herein include at least two different layers which are made of the first and second material, respectively. This two-layer design allows to reduce or even avoid any warpage of such arrangements. The warpage results from different coefficients of thermal expansion of the semiconductor chips and the second material. The first material has a function to equalize such warpage. As a consequence, large arrangements (artificial wafers) with a spatial dimension larger than 20 cm, for instance 30 cm or more, may be fabricated. On the other hand, without first material, the maximum lateral dimension of such artificial wafers would be limited by warpage.

For instance, if the thermal expansion of the semiconductor chips is small compared to the thermal expansion of the second material, a high thermal expansion of the first material compared to the thermal expansion of the second material may result in that the overall thermal expansion of the arrangement near or at a first main surface, where the semiconductor chips and the first material are arranged, will be matched to the overall thermal expansion near or at the other main surface, where the second material is arranged. Therefore, artificial wafers of such design may exhibit no or only small warpage.

Further, the matching of the overall thermal expansion at both main surfaces of the arrangement and thus the extent to which warpage is eliminated depends on geometry, i.e. on the lateral dimension of the chips, on the length of the spacing between the chips and on the extent to which the spacing is filled by the first material.

Typically, the first material may have a coefficient of thermal expansion in the range of 20 to $200 \cdot 10^{-6}$/K, the second material may have a coefficient of thermal expansion in the range of 6 to $20 \cdot 10^{-6}$/K (typical second mold compound materials exhibit a coefficient of thermal expansion of about $9 \cdot 10^{-6}$/K) and the semiconductor chips may have e.g., a coefficient of thermal expansion of about $2.8 \cdot 10^{-6}$/K (silicon). The semiconductor chips may be of a semiconductor material different from silicon. In such cases, the above ranges for the coefficients of thermal expansion of the first and second materials may still apply. The selection of the coefficients of thermal expansion of the different materials is also depending on the die sizes and the gap between the dies.

FIG. 1 schematically illustrates a first embodiment of an arrangement 100.1 of semiconductor chips 101. A plurality of semiconductor chips 101 (typically more than 3 as illustrated) is arranged side by side in a spaced apart relationship. A first material 102 fills the spacings between adjacent semiconductor chips 101. Alternatively, the first material 102 may be deposited such that the spacings are only partly filled in the lateral dimension, cf. FIG. 3. A second material 103 is arranged over the semiconductor chips 101 and the first material 102. One main surface of the semiconductor chips 101 and one surface of the first material 102 form a common plane which constitutes a first main surface 104 of the arrangement 100.1 representing an artificial wafer. The thickness of the first material 102, that is its extension perpendicular to the lateral extension of the artificial wafer, may e.g., be chosen in a range between 20 to 200% of the thickness of the semiconductor chips 101. The semiconductor chips 101 may e.g., have a thickness of 100 μm to 300 μm or more. The second material 103 covers with its first main surface the first material 102 and the semiconductor chips 101. The second main surface of the second material 103 forms the second main surface 105 of the artificial wafer.

Figure 2:
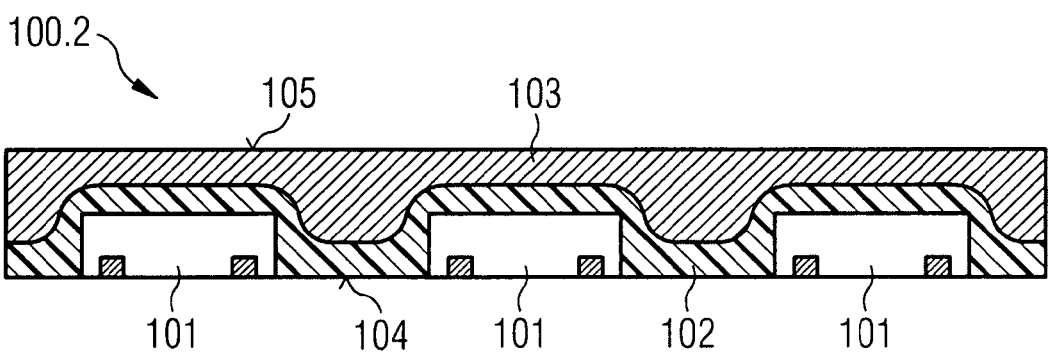
FIG. 2 schematically illustrates a second embodiment of an arrangement of semiconductor chips.

A second embodiment represented by an arrangement 100.2 is illustrated in FIG. 2. This embodiment is similar to the embodiment of FIG. 1. Therefore the features described above in conjunction with FIG. 1 are also related to this embodiment except for the modifications described below.

In FIG. 2 the first material 102 covers the semiconductor chips 101. The semiconductor chips 101 may be completely covered (as illustrated) or may be covered only partly (not illustrated). In the first case, the first material 102 completely separates the plurality of semiconductor chips 101 from the second material 103. In the second case, when only the side edges or parts thereof are covered with the first material 102, the semiconductor chips 101 are not completely separated from the second material 103.

Figure 3:
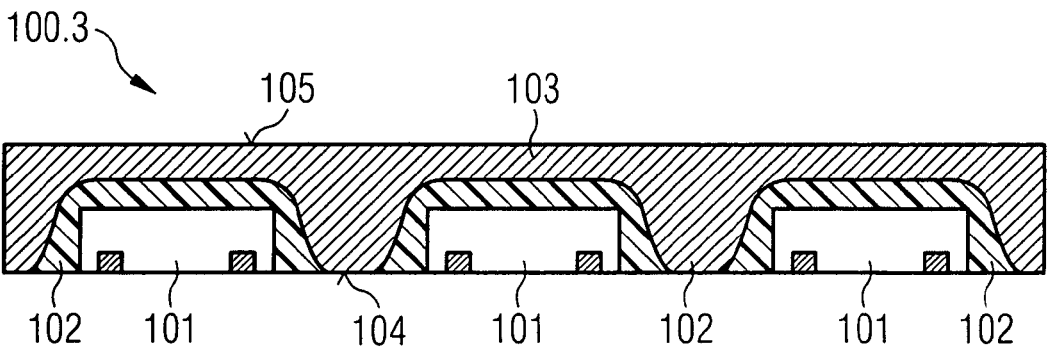
FIG. 3 schematically illustrates a third embodiment of an arrangement of semiconductor chips.

FIG. 3 illustrates an arrangement 100.3 as a third embodiment. Here, the spacings between adjacent semiconductor chips 101 are only partly filled by the first material 102. Thus, the second material 103 reaches up to the first main surface 104 of the arrangement 100.3 and forms a part thereof.

In all embodiments, as already mentioned, the first material 102 may be made e.g., of a curable liquid which is deposited at appropriate places and/or spread out by a distribution process (e.g., spin coating), or it may be made of a foil which is deposited (e.g., laminated) onto the semiconductor chips 101 (or around the semiconductor chips 101 if a masked foil is used) and fitted into the spacings by the application of heat and/or pressure.

The overall thermal expansion of the artificial wafer at the first main surface 104 of the arrangements 100.1 and 100.2 is determined by the lateral extension of the semiconductor chips 101 and the lateral extension of the first material 102 at the first main surface 104 and their coefficients of thermal expansion. In the arrangement 100.3, also the lateral extension of the second material 103 at the first main surface 104 and its coefficient of thermal expansion has to be taken into account. The thermal expansion of the second main surface 105 is determined by the coefficient of thermal expansion of the second material 103 and the lateral dimension of the arrangements 100.1, 100.2, 100.3. If the artificial wafer should exhibit no warpage during a change of temperature, the lateral expansion at or near the first main surface 104 has to equal the lateral expansion at or near the second main surface 105. Therefore, the coefficient of the thermal expansion of the first material 102 is selected to adapt the lateral thermal expansion of the arrangement in a plane intersecting the first material 102 and the semiconductor chips 101 to the lateral thermal expansion of the arrangements 100.1, 100.2, 100.3 in a plane intersecting the second material 103 but typically not the semiconductor chips 101 and the first material 102. The aforementioned planes may be represented by the first main surface 104 and the second main surface 105, respectively.

Since the coefficient of thermal expansion of the semiconductor chips 101 in most cases is smaller than the coefficient of thermal expansion of the second material 103, the coefficient of thermal expansion of the first material 102 should be larger than the coefficient of thermal expansion of the second material 103 to equalize the lateral expansion at both main surfaces 104, 105 of the artificial wafer.

Figure 4:
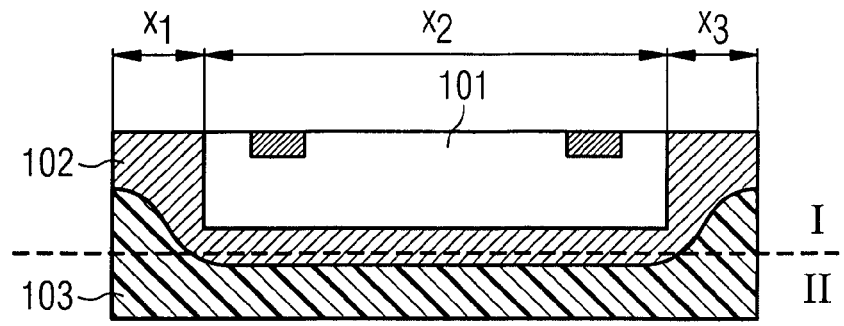
FIG. 4 illustrates a partial section of the arrangement illustrated in FIG. 2.

In other words, to minimize the warpage, the overall lateral expansion near or at one main surface of the artificial wafer should equal the overall lateral expansion near or at the other surface during a temperature change in the range of the processing temperatures (up to about 200° C. or even more). Referring to FIG. 4, which illustrates a cross sectional view of a partial structure of the arrangement 100.2, this condition can be expressed by $$x_1 \cdot CTE_1 + x_2 \cdot CTE_2 + x_3 \cdot CTE_1 = (x_1 + x_2 + x_3) \cdot CTE_3 \quad (1)$$

wherein $x_2$ is the lateral extension of the semiconductor chip 101 and $x_1$ and $x_3$ are lateral extensions of the first material surrounding the semiconductor chip 101. $CTE_1$, $CTE_2$ and $CTE_3$ are the coefficients of thermal expansion of the first material 102, the semiconductor chip 101 and the second material 103, respectively. This condition ensures that the overall lateral expansion in a region I above the dashed line in FIG. 4 corresponds to the overall lateral expansion in a region II below the dashed line, if the partial structure is subjected to a temperature change. As the partial structure of the arrangement 100.2 illustrated in FIG. 4 may be understood to represent a "unit cell" of the arrangement 100.2, i.e. the arrangement 100.2 is established by a periodic translational repetition of this partial structure in the x-direction, the condition (1) applies both for the partial structure illustrated in FIG. 4 and for the entire arrangement 100.2. In most cases, $$x_1 = x_3$$

Equation (1) also applies to a partial structure of the arrangement 100.1. A condition similar to equation (1) holds for the arrangement 100.3, namely $$x_4 \cdot CTE_3 + x_1 \cdot CTE_1 + x_2 \cdot CTE_2 + x_3 \cdot CTE_1 + x_5 \cdot CTE_3 = (x_1 + x_2 + x_3 + x_4 + x_5) \cdot CTE_3 \quad (2)$$

Here, $x_4$ and $x_5$ are lateral extensions of the second material 103 at the first surface 104 of the arrangement 100.3 next to the left and right side of the first material 102, respectively.

Figure 5:
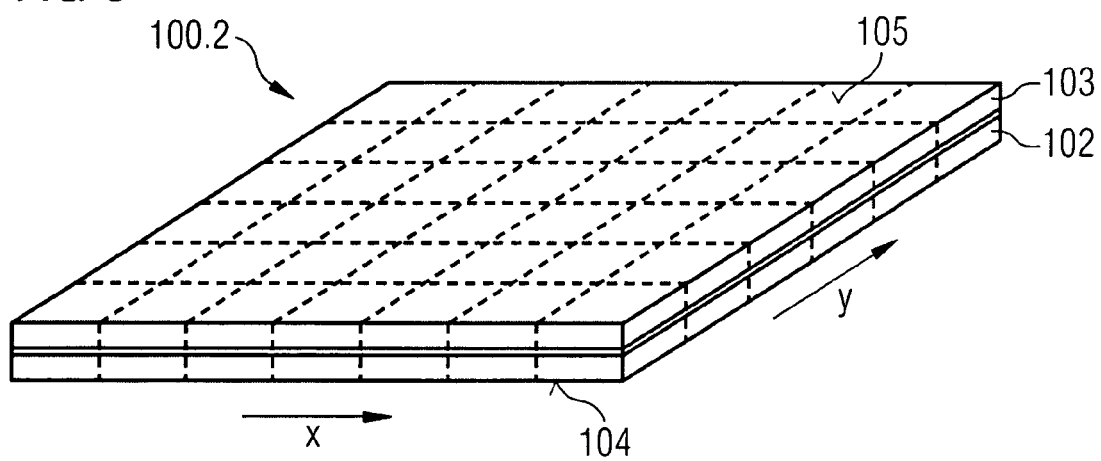
FIG. 5 illustrates a perspective view of the arrangement illustrated in FIG. 2.

FIG. 5 illustrates a perspective view of the arrangement 100.2 (i.e. the artificial wafer) illustrated in FIG. 2. The arrangement has a rectangular shape with side dimensions which may be larger than 20 cm or even larger than 30 cm. Cells indicated by dashed lines correspond to the partial structure or "unit cell" as depicted in FIG. 4. It is to be noted that equation (1), which relates to the x-direction, should analogously be satisfied for the y-direction in order to avoid warpage in the x-y plane. Alternatively, the arrangement 100.2 may have another polygonal shape or a curved or circular shape. Further, the arrangements 100.1 and 100.3 may be configured the same way as depicted in FIG. 5 and described above.

It is easy to see how the conditions (1) or (2) are to be modified if more than 2 layer materials are used or if, for example, also the second main surface 105 is composed of two or more materials with different thermal expansion coefficients.

To adapt the overall lateral expansion of the first main surface 104 of the artificial wafer to the overall lateral expansion of the second main surface 105 of the artificial wafer, the first material and/or the second material may be filled with a filling material, often referred to as a "filler". As mentioned above a variety of materials are possible. The degree of filling and the physical properties of the filler affect the thermal expansion characteristics of the first material so that a wide range of coefficients of thermal expansion as mentioned above is possible. In addition to the expansion characteristics of the filled first and/or second material, their viscosity can be modified via the filling degree and the particle size. Using a first material filled by metal particles, the deposition of first material onto the semiconductor chips leads to an enhanced thermal conductivity for the packaging of power semiconductor chips.

Figure 6:
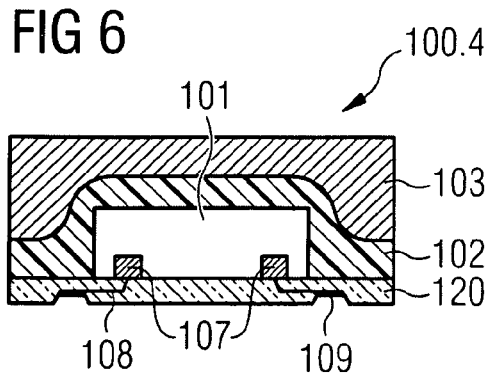
FIG. 6 illustrates a module containing a semiconductor chip.

FIG. 6 illustrates a module 100.4 having a semiconductor chip 101 which is produced from an artificial wafer 100.2 by a separation step. The fabrication process will be explained in detail later in conjunction with FIGS. 7A to 7E. At its active surface, the semiconductor chip 101 is provided with chip contacts 107. The active surface of the semiconductor chip 101 and the area of the first material 102 adjacent to the active surface is covered by an insulating dielectric polymer layer 120 and an electrically conductive redistribution layer. Conductive lines 108 formed within the redistribution layer connect the chip contacts 107 to contact pads 109 of the module 100.4. The contact pads 109 represent external terminals of the module 100.4, to which solder balls may be applied. As apparent for a person skilled in the art, a "fan out" type structure is obtained, in which the external contact pads 109 are located at least partially beyond the lateral outline of the semiconductor chip 101.

Modules obtained from the arrangements 100.1 and 100.3 are not explicitly illustrated. Likewise, such modules are obtained by separation of the arrangements 100.1 and 100.3 and are similar to module 100.4 in view of the insulating dielectric polymer layer 120, the electrically conductive redistribution layer and the external contact pads 109.

Figure 7A:
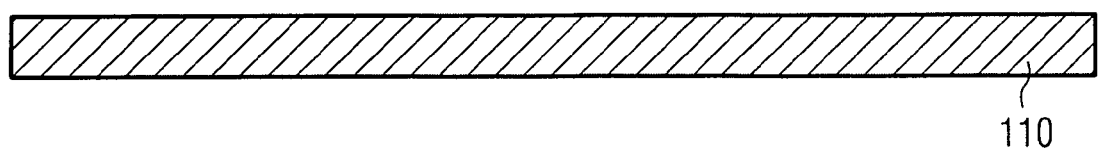
FIGS. 7A to 7F illustrate a method to produce an arrangement of semiconductor chips.
Figure 7B:
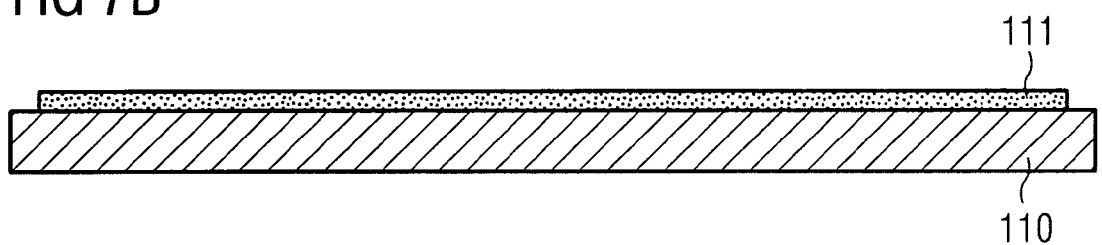

FIGS. 7A to 7F illustrate a method to produce an arrangement 100.2 of semiconductor chips 101. In FIG. 7A a carrier 110 is provided which is used to carry a plurality of semiconductor chips 101. The carrier 110 may e.g., be made of metal, silicon or a polymer material. The carrier 110 may be equipped with an optional adhesive layer 111 (FIG. 7B) which could be a double sided adhesive tape. Other holding means, such as through holes penetrating the carrier 110 for vacuum application, may alternatively be used. Alternatively, the foil which is laminated later on over the chips may serve as the sole holding means.

Figure 7C:
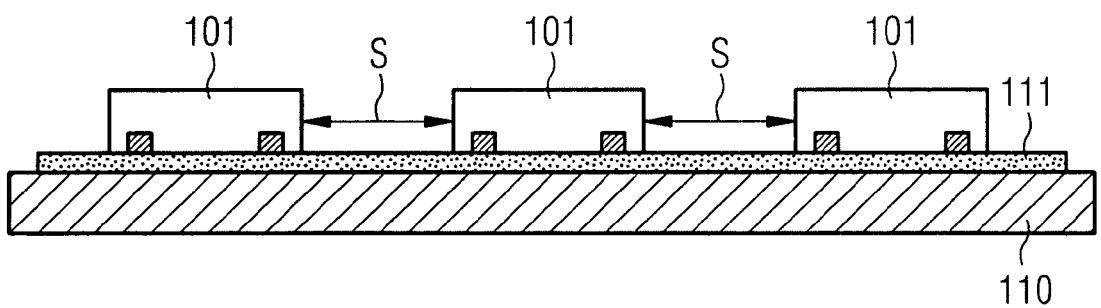
Figure 7D:
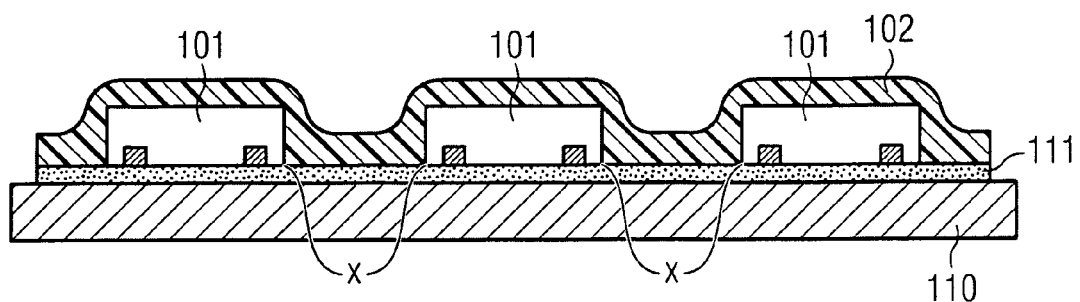

The semiconductor chips 101 are deposited onto the adhesive layer 111 in a spaced apart relationship so that spacings S are generated between each two semiconductor chips 101 (FIG. 7C). Then the spacings S between adjacent semiconductor chips 101 are filled with a first material 102. To this end, the first material 102 is applied as e.g., a curable liquid into the spacings S or into the spacings S and onto the semiconductor chips 101 by printing or dispensing techniques. A stamp may be used to spread out the first material 102 into the spacings. FIG. 7D illustrates a distribution of the first material covering the semiconductor chips 101 and filling the spacings S in a trough-like shape. Nevertheless other distributions are possible, e.g., the spacings S may be completely filled (in view of their height dimension) or even overfilled so that the thickness of the first material 102 in the spacings S is larger than the thickness of the semiconductor chips 101. After depositing the first material 102, an infrared radiation source or another heating source may be used to cure the first material 102.

As first material 102 a foil may be used to fill the spacings S between the semiconductor chips 101. The foil is laminated onto the semiconductor chips 101 and onto the carrier 110. The foil may completely embed the semiconductor chips 101 and fix them in place. As only very small lateral forces are applied during the process of foil lamination, also small elements such as passive components (resistors, capacitors, inductors) may be embedded by lamination. Then, the foil may be heated and optionally melted by an infrared radiation source or another heating source in order to assist the foil to flow into the spacings S. In general, any form of energy may be applied to heating up or melting the foil. This process may be assisted by a mechanical process such as a stamping process, lamination process and/or the application of atmospheric pressure. For instance, a vacuum may be applied through openings (not illustrated) in the carrier 110 at regions marked with X in FIG. 7D.

Figure 7E:
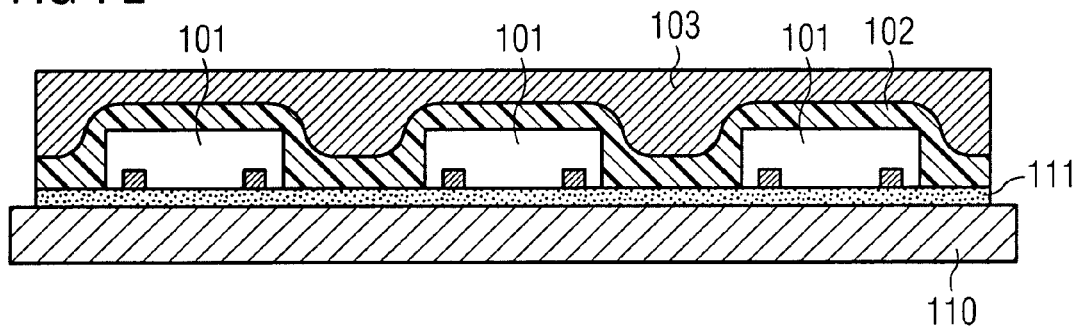
Figure 7F:
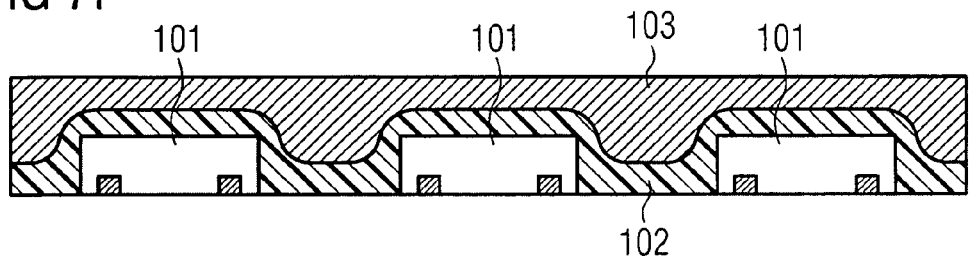
Figure 7G:
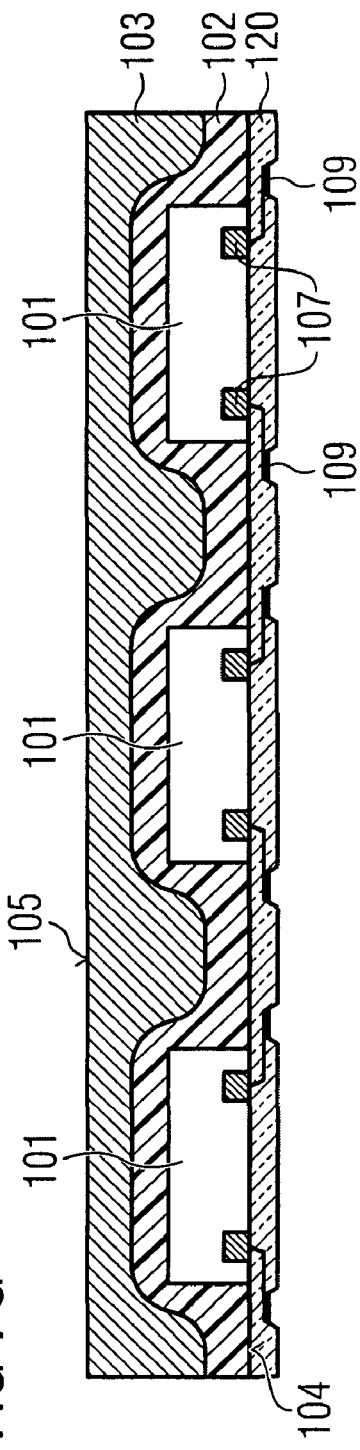
FIGS. 7G and 7H illustrate processing to produce modules from the arrangement of FIG. 7F.
Figure 7H:
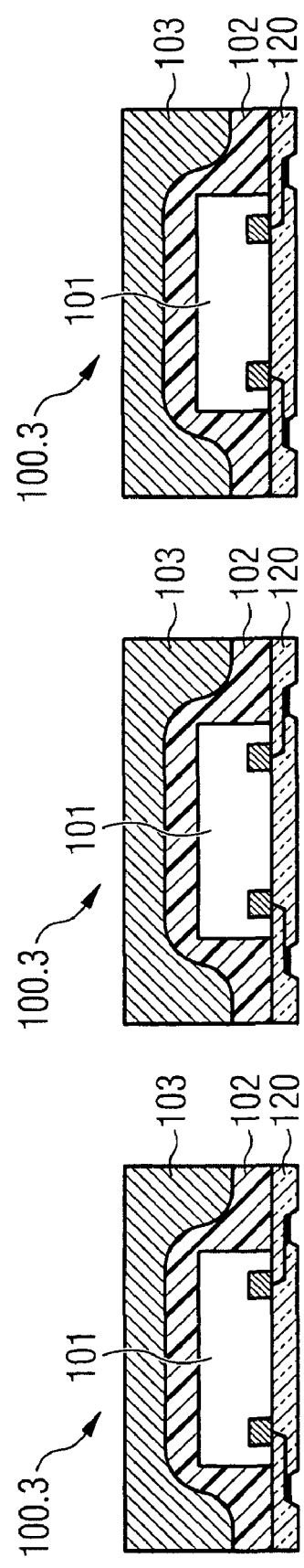

In a next process the second material 103 is deposited on the first material 102 and on the semiconductor chips 101 in a mold tool (FIG. 7E). Then the overmolded semiconductor chips 101 are removed from the mold tool and the arrangement is released from the carrier (FIG. 7F). Subsequently, the arrangement may be equipped with an electrically conductive redistribution layer 108. To this end, at least one dielectric layer 120 and a structured metallization may be generated on the first main surface 104 of the arrangement (FIG. 7G). Thin film process techniques may be used to generate and structure these layers. For instance, the dielectric layer 120 may be generated by spin coating or chemical vapor deposition (CVD) techniques and may be structured by photolithography. The metallization may be generated by a printing process or by galvanic or electroless plating. This way, the chip contacts 107 are connected to the conductive lines 108 formed in the metal redistribution layer and the conductive lines 108 are connected to the contact pads 109 which represent external terminals of the modules to be fabricated. All these processes may be done at (artificial) wafer level. At least the semiconductor chips 101 may be separated from each other for example by a sawing process to generate modules 100.4. (FIG. 7H).

Figure 8A:
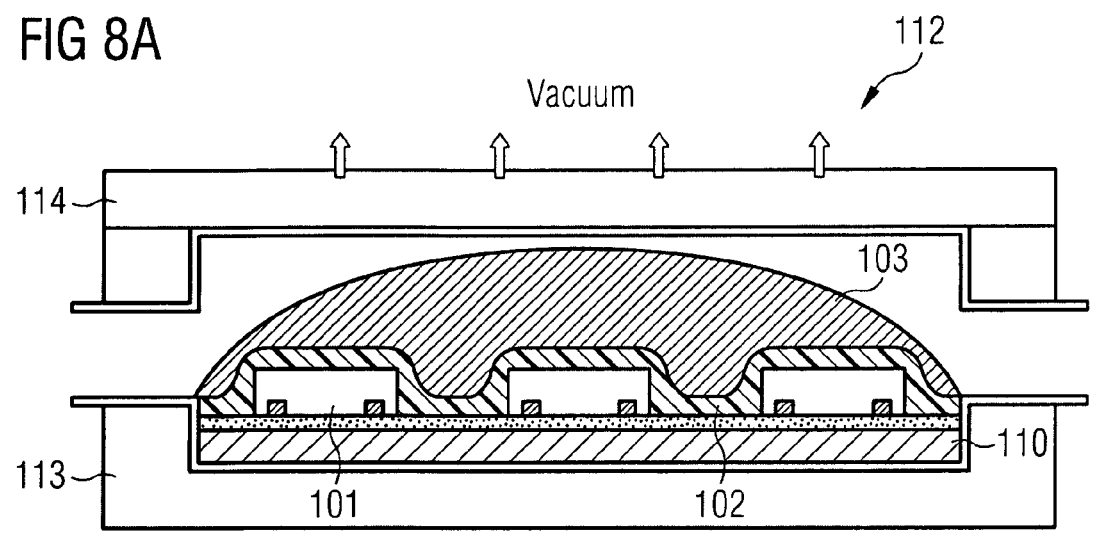
FIGS. 8A and 8B illustrate processing to overmold a configuration of a plurality of semiconductor chips in a mold tool.
Figure 8B:
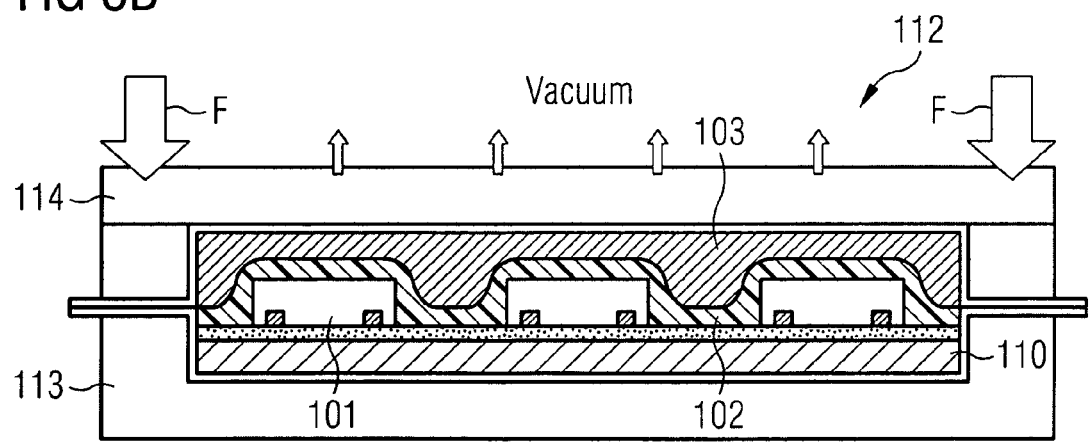

FIGS. 8A and 8B illustrate method processes to overmold the semiconductor chips 101 arranged on the carrier 110 and covered by the first material 102 in a mold tool 112. A similar process could also be applied to deposit the first material 102 on the semiconductor chips 101 and on the carrier 110. The carrier 110, the adhesive layer 111, the semiconductor chips 101 and the first material 102 are positioned in the lower half 113 of the mold tool 112. The upper half 114 of the mold tool 112 is in its open position. An amount of the second material 103 is dispensed onto the first material 102. Then the mold tool 112 is closed by driving the upper half 114 towards the lower half 113 and exerting a force ("F"-arrows) to the mold tool 112. The small arrows are illustrative of a vacuum which may be applied inside the mold tool 112 to assist the spreading of the second material 103. By closing the mold tool 112 the second material 103 is compressed and fills the cavity of the mold tool 112. The mold tool 112 may be heated up (e.g., to about 200° C.) for curing of the second material 103.

The glass temperature of the second material 103 should be approximately equal or a little bit larger (up to a few tens degrees) than the glass temperature of the first material 102. For example, if the glass temperature of the first material 102 amounts to e.g., 160° C., the glass temperature of the second material 103 should not exceed 200° C. The glass temperatures of the first and second materials 102 and 103 may also be set by the selection of an appropriate filler and its physical properties as mentioned above.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

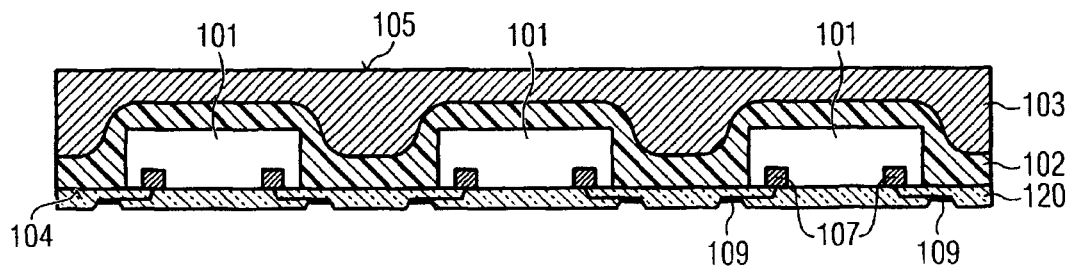

What is claimed is:

1. An arrangement, comprising:
   a plurality of semiconductor chips arranged side by side in a spaced apart relationship;
   a first material filling at least partly the spacings between adjacent semiconductor chips; and
   a second material arranged over the semiconductor chips and the first material,
   wherein a coefficient of thermal expansion of the first material is selected to adapt the lateral thermal expansion of the arrangement in a plane intersecting the first material and the semiconductor chips to the lateral thermal expansion of the arrangement in a plane intersecting the second material.

2. The arrangement of claim 1, comprising wherein the coefficient of thermal expansion of the first material is larger than the coefficient of thermal expansion of the second material.

3. The arrangement of claim 1, comprising wherein the first material is a foil.

4. The arrangement of claim 1, comprising wherein the first material is made of a curable liquid.

5. The arrangement of claim 1, comprising wherein the first material is one of the group consisting of an epoxy resin, a phenol resin or a thermosetting plastic.

6. The arrangement of claim 1, comprising wherein the first material is filled with a particle-containing filler.

7. The arrangement of claim 6, wherein the filler comprises at least one of the group of glass particles, metal particles or ceramic particles.

8. The arrangement of claim 1, wherein the first material at least partially covers the semiconductor chips.

9. The arrangement of claim 1, comprising wherein the first material separates the plurality of semiconductor chips from the second material.

10. The arrangement of claim 1, comprising wherein a lateral dimension of the arrangement is larger than 20 cm, in particular 30 cm.

11. An arrangement of semiconductor chips, comprising:
    a plurality of semiconductor chips arranged side by side in a spaced apart relationship;
    a first material filling at least partly the spacings between adjacent semiconductor chips; and
    a second material arranged over the semiconductor chips and the first material,
    wherein the coefficient of thermal expansion of the first material is in the range of 50 to $100 \cdot 10^{-6}$/K and the coefficient of thermal expansion of the second material is in the range of 6 to $20 \cdot 10^{-6}$/K.

12. The arrangement of claim 11, comprising wherein the first material is a foil.

13. The arrangement of claim 11, comprising wherein the first material is made of a curable liquid.

14. The arrangement of claim 11, comprising wherein the first material separates the plurality of semiconductor chips from the second material.

15. The arrangement of claim 11, comprising wherein a lateral dimension of the arrangement is larger than 20 cm.

16. A module, comprising:
a semiconductor chip;
a first material laterally surrounding the semiconductor chip; and
a second material arranged over the semiconductor chip and the first material,
wherein a coefficient of thermal expansion of the first material is selected to adapt the lateral thermal expansion of the module in a plane intersecting the first material and the semiconductor chips to the lateral thermal expansion of the module in a plane intersecting the second material.

17. The module of claim 16, comprising wherein the first material is a foil.

18. The module of claim 16, comprising wherein the first material is made of a curable liquid.

* * * * *

UNITED STATES PATENT AND TRADEMARK OFFICE
CERTIFICATE OF CORRECTION

PATENT NO.         : 7,906,860 B2
APPLICATION NO.    : 11/925312
DATED              : March 15, 2011
INVENTOR(S)        : Thorsten Meyer et al.

It is certified that error appears in the above-identified patent and that said Letters Patent is hereby corrected as shown below:

IN THE CLAIMS:
Column 10, line 8, insert the following

--19.  A method to produce an arrangement of semiconductor chips, comprising:
   arranging the semiconductor chips in a spaced apart relationship on a carrier;
   filling the spacings between adjacent semiconductor chips with a first material; and
   arranging a second material over the semiconductor chips and the first material,
   including selecting a coefficient of thermal expansion of the first material is selected to adapt the lateral thermal expansion of the arrangement in a plane intersecting the first material and the semiconductor chips to the lateral thermal expansion of the arrangement in a plane intersecting the second material.

20.  The method of claim 19, comprising applying the first material as a foil which is laminated onto the carrier mounting the semiconductor chips.

21.  The method of claim 20, further comprising:
   pressurizing and/or heating the foil in order to assist the filling of the spacings.

22.  The method of claim 19, comprising applying the first material as a curable liquid dispensed or printed onto the carrier mounting the semiconductor chips.

Signed and Sealed this
Thirty-first Day of May, 2011

David J. Kappos
*Director of the United States Patent and Trademark Office*

CERTIFICATE OF CORRECTION (continued)
U.S. Pat. No. 7,906,860 B2

23. The method of claim 22, further comprising:
    introducing energy to cure the curable liquid prior to arranging the second material.

24. The method of claim 19, further comprising:
    separating the carrier from the arrangement of semiconductor chips.

25. A method to produce an arrangement of semiconductor chips, comprising:
    arranging the semiconductor chips in a spaced apart relationship on a carrier;
    filling the spacings between adjacent semiconductor chips with a first material; and
    arranging a second material over the semiconductor chips and the first material,
    wherein the coefficient of thermal expansion of the first material is in the range of 50 to $100 \cdot 10^{-6}/K$ and the coefficient of thermal expansion of the second material is in the range of 6 to $20 \cdot 10^{-6}/K$.--.

UNITED STATES PATENT AND TRADEMARK OFFICE
CERTIFICATE OF CORRECTION

| | | |
|---|---|---|
| PATENT NO. | : 7,906,860 B2 | Page 1 of 3 |
| APPLICATION NO. | : 11/925312 | |
| DATED | : March 15, 2011 | |
| INVENTOR(S) | : Thorsten Meyer et al. | |

It is certified that error appears in the above-identified patent and that said Letters Patent is hereby corrected as shown below:

Delete the title page and substitute therefore the attached title page showing the corrected number of claims in patent.

IN THE CLAIMS:
Column 10, line 8, insert the following
--19.   A method to produce an arrangement of semiconductor chips, comprising:
arranging the semiconductor chips in a spaced apart relationship on a carrier;
filling the spacings between adjacent semiconductor chips with a first material; and
arranging a second material over the semiconductor chips and the first material,
including selecting a coefficient of thermal expansion of the first material is selected to adapt the lateral thermal expansion of the arrangement in a plane intersecting the first material and the semiconductor chips to the lateral thermal expansion of the arrangement in a plane intersecting the second material.

20.   The method of claim 19, comprising applying the first material as a foil which is laminated onto the carrier mounting the semiconductor chips.

21.   The method of claim 20, further comprising:
pressurizing and/or heating the foil in order to assist the filling of the spacings.

This certificate supersedes the Certificate of Correction issued May 31, 2011.

Signed and Sealed this
Twenty-eighth Day of June, 2011

David J. Kappos
*Director of the United States Patent and Trademark Office*

22. The method of claim 19, comprising applying the first material as a curable liquid dispensed or printed onto the carrier mounting the semiconductor chips.

23. The method of claim 22, further comprising:
introducing energy to cure the curable liquid prior to arranging the second material.

24. The method of claim 19, further comprising:
separating the carrier from the arrangement of semiconductor chips.

25. A method to produce an arrangement of semiconductor chips, comprising:
arranging the semiconductor chips in a spaced apart relationship on a carrier;
filling the spacings between adjacent semiconductor chips with a first material; and
arranging a second material over the semiconductor chips and the first material,
wherein the coefficient of thermal expansion of the first material is in the range of $50$ to $100 \cdot 10^{-6}/K$ and the coefficient of thermal expansion of the second material is in the range of $6$ to $20 \cdot 10^{-6}/K$.--.

(12) United States Patent
Meyer et al.

(10) Patent No.: US 7,906,860 B2
(45) Date of Patent: Mar. 15, 2011

(54) SEMICONDUCTOR DEVICE

(75) Inventors: Thorsten Meyer, Regensburg (DE); Markus Brunnbauer, Lappersdorf (DE); Marcus Kastner, Regensburg (DE); Stephan Bradl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 650 days.

(21) Appl. No.: 11/925,312

(22) Filed: Oct. 26, 2007

(65) Prior Publication Data

US 2009/0108440 A1 Apr. 30, 2009

(51) Int. Cl.
*H01L 23/29* (2006.01)

(52) U.S. Cl. ........ 257/790; 257/E21.502; 257/723; 257/778; 257/787; 438/124; 438/126; 438/127

(58) Field of Classification Search ........ 257/E21.499, 257/E21.502, E23.135, 659, 690, 698, 699, 257/704, 723, 778, 787, 790; 438/112, 127; 174/260; 361/812; 29/841
See application file for complete search history.

(56) References Cited

U.S. PATENT DOCUMENTS

| | | | | |
|---|---|---|---|---|
| 5,311,059 A * | 5/1994 | Banerji et al. | | 257/778 |
| 5,381,599 A * | 1/1995 | Hall | | 29/856 |
| 5,734,201 A * | 3/1998 | Djennas et al. | | 257/783 |
| 5,737,191 A * | 4/1998 | Horiuchi et al. | | 361/764 |
| 6,166,434 A * | 12/2000 | Desai et al. | | 257/704 |
| 6,288,900 B1 * | 9/2001 | Johnson et al. | | 361/705 |
| 6,353,263 B1 * | 3/2002 | Dotta et al. | | 257/777 |
| 6,354,485 B1 * | 3/2002 | Distefano | | 228/179.1 |
| 6,369,449 B2 * | 4/2002 | Farquhar et al. | | 257/778 |
| 6,376,769 B1 * | 4/2002 | Chung | | 174/524 |
| 6,518,090 B2 * | 2/2003 | Saza et al. | | 438/106 |
| 6,621,172 B2 * | 9/2003 | Nakayama et al. | | 257/787 |
| 6,713,878 B2 * | 3/2004 | Goetschalckx | | 257/778 |
| 6,747,350 B1 * | 6/2004 | Lin et al. | | 257/704 |
| 6,879,030 B2 * | 4/2005 | Tsai et al. | | 257/680 |
| 6,992,400 B2 | 1/2006 | Tikka et al. | | |
| 6,998,296 B2 * | 2/2006 | Reiss | | 438/112 |
| 7,091,623 B2 * | 8/2006 | Tsai et al. | | 257/783 |
| 7,173,336 B2 * | 2/2007 | Sakamoto et al. | | 257/739 |
| 7,187,060 B2 * | 3/2007 | Usui | | 257/659 |
| 7,205,674 B2 * | 4/2007 | Huang et al. | | 257/787 |
| 7,268,067 B2 * | 9/2007 | Hall et al. | | 438/617 |
| 7,319,275 B2 * | 1/2008 | Cowens et al. | | 257/778 |
| 7,445,963 B2 * | 11/2008 | Ho et al. | | 438/113 |
| 7,534,002 B2 * | 5/2009 | Yamaguchi et al. | | 362/84 |
| 7,619,304 B2 * | 11/2009 | Bauer et al. | | 257/678 |

(Continued)

OTHER PUBLICATIONS

"Embedded Wafer Level Ball Grid Array (eWLB)", M. Brunnbauer, et al., 2006 Electronics Packaging Technology Conference, 2006 IEEE.

*Primary Examiner* — Chris Chu
(74) *Attorney, Agent, or Firm* — Dicke, Billig & Czaja, PLLC

(57) ABSTRACT

A semiconductor device is disclosed. One embodiment provides an arrangement of a plurality of semiconductor chips arranged side by side in a spaced apart relationship. A first material fills at least partly the spacings between adjacent semiconductor chips. A second material is arranged over the semiconductor chips and the first material. A coefficient of thermal expansion of the first material is selected to adapt the lateral thermal expansion of the arrangement in a plane intersecting the first material and the semiconductor chips to the lateral thermal expansion of the arrangement in a plane intersecting the second material.

25 Claims, 6 Drawing Sheets